United States Patent
Fukasawa

[19]

[11] Patent Number: 5,973,931
[45] Date of Patent: Oct. 26, 1999

[54] PRINTED WIRING BOARD AND ELECTRONIC DEVICE USING SAME

[75] Inventor: Hiroyuki Fukasawa, Oita, Japan

[73] Assignee: Sony Corporation, Tokyo, Japan

[21] Appl. No.: 09/201,203

[22] Filed: Nov. 30, 1998

Related U.S. Application Data

[63] Continuation of application No. 08/622,873, Mar. 29, 1996, Pat. No. 5,844,782.

[51] Int. Cl.$^6$ .................................................... H05K 1/18
[52] U.S. Cl. .................... 361/774; 361/736; 361/746; 361/760; 361/807; 361/809; 257/737; 257/738; 257/787; 257/788; 257/782; 174/255; 174/256; 174/259; 174/260
[58] Field of Search .................................... 361/736, 746, 361/760, 779, 783, 807, 809, 774; 257/737, 738, 786, 784, 787, 788, 793, 778, 782; 174/259, 260, 255, 256; 228/123.1

[56] References Cited

U.S. PATENT DOCUMENTS

| | | | |
|---|---|---|---|
| 4,263,606 | 4/1981 | Yorikane | 357/71 |
| 4,970,571 | 11/1990 | Yamakawa et al. | 357/71 |
| 5,378,859 | 1/1995 | Shirasaki et al. | 174/261 |
| 5,539,153 | 7/1996 | Schwiebert et al. | 174/260 |
| 5,637,832 | 6/1997 | Danner | 174/260 |

OTHER PUBLICATIONS

Patent Abstracts of Japan, vol. 95, No. 10, Nov. 30, 1995, JP 7–193162A (Hitachi Ltd.) Jul. 28, 1995.
Patent Abstracts of Japan, vol. 97, No. 3, Mar. 31, 1997, JP 8–306824A (Citizen Watch Co. Ltd.) Nov. 22, 1996.
Patent Abstracts of Japan, vol. 97, No. 2, Feb. 1997, JP 8–274241 A, (Toshiba Corp.) Oct. 18, 1996.

*Primary Examiner*—Leo P. Picard
*Assistant Examiner*—David Foster
*Attorney, Agent, or Firm*—Hill & Simpson

[57] ABSTRACT

A printed wiring board and an electronic device using the same with which the formation of cracks in base portions of projecting external electrodes formed on lands on the printed wiring board is certainly prevented. With respect to a printed wiring board 11 having lands 16 formed in a wiring pattern where external electrodes 13 are to be formed and a pattern-protecting film 17 having openings 17a where the external electrodes 13 are to be formed, the opening diameter D1 of the openings 17a in the pattern-protecting film 17 is set greater by a predetermined dimension than the external diameter D2 of the lands 16 and a gap is thereby provided between each of the external electrodes 13 and the pattern-protecting film 17 so that the external electrodes 13 and the pattern-protecting film 17 do not make contact with each other and as a result there is no cracking of the external electrodes 13 caused by differential thermal expansion of the external electrodes 13 and the pattern-protecting film 17. An electronic module comprising the electronic device of the invention mounted on a mother board can be widely used by being incorporated into various types of electronic equipment.

2 Claims, 3 Drawing Sheets

5,973,931

PRINTED WIRING BOARD AND ELECTRONIC DEVICE USING SAME

This application is a continuation of Ser. No. 08/622,873, filed Mar. 29, 1996 now U.S. Pat. No. 5,944,782.

BACKGROUND OF THE INVENTION

This invention relates to a printed wiring board on which various electronic components are mounted having on one side thereof lands for forming external electrodes on and an electronic device using this printed wiring board.

Semiconductor devices called BGAs (ball grid arrays) are typical known electronic devices of this kind.

As shown in FIG. 1, a BGA is a device made by mounting a semiconductor device 2 on one side (the upper side) of a printed wiring board 1 of about 1 mm in thickness made of an organic material or an inorganic material and disposing projecting external electrodes 3 in a predetermined array, for example in the form of a matrix, on the other side (the lower side) of the printed wiring board 1. The semiconductor device 2, which is an active component, is connected by for example gold bonding wires 4 to a wiring pattern on the printed wiring board 1 and encapsulated in this state together with the bonding wires 4 by a molded resin 5.

These external electrodes 3, as shown enlarged in FIG. 2A, are each formed on a circular land 6 made of a conducting material such as copper foil, and a pattern-protecting film 7 made of solder resist or the like is formed around the periphery of this land 6, exposing the land 6. The external electrodes 3, which are connecting electrodes for connecting the printed wiring board 1 to a mother board or the like, are formed after the semiconductor device 2 is encapsulated with the molded resin 5 so that they project from the underside of the printed wiring board 1 by heating and thereby melting solder grains or solder paste or the like supplied to the lands 6.

However, in this printed wiring board 1 of the related art, the pattern-protecting film 7 is formed on the peripheral portions of the lands 6 as well as around them, and when the external electrodes 3 are formed on the lands 6 the external electrodes 3 and the pattern-protecting film 7 come into contact with each other. Because of this there has been the problem that when the device is mounted on a mother board or is temperature cycle tested, thermal stresses arise in the base portions of the external electrodes 3 due to a difference in thermal expansion coefficient between the external electrodes 3 and the pattern-protecting film 7 and cracks (microcracks) 3a form in these base portions of the external electrodes 3 as shown in FIG. 2B.

This has resulted in the semiconductor device having fatal flaws such as that crack formation causes external electrodes 3 to come off the printed wiring board 1 and make electrical connection of the printed wiring board 1 to the mother board impossible or the insides of cracks oxidize and the electrical resistance increases, adversely influencing the device characteristics.

SUMMARY OF THE INVENTION

The present invention was devised to solve the problems described above, and an object of the invention is to provide a printed wiring board and an electronic device using the same with which the formation of cracks in base portions of external electrodes formed on lands is certainly prevented.

To achieve this object and other objects, the invention provides a printed wiring board comprising on one side thereof lands formed in a wiring pattern where external electrodes are to be formed and a pattern-protecting film having openings where the external electrodes are to be formed, wherein the diameter of the openings in the pattern-protecting film is larger by a predetermined dimension than the external diameter of the lands.

In a printed wiring board according to the invention, because the diameter of the openings in the pattern-protecting film is larger than the external diameter of the lands, in forming projecting external electrodes on these lands, suitable gaps are provided between the pattern-protecting film and the external electrodes. As a result, even if thermal expansion or thermal contraction due to temperature changes occurs, because the pattern-protecting film and the external electrodes never make contact with each other, thermal stresses in the base portions of the external electrodes are avoided and the formation of cracks there is prevented.

According to the present invention, an electronic device using the above-mentioned printed wiring board may be mounted on a mother board to provide an electronic module which can be widely used by being incorporated into a variety of types of electronic equipment.

DETAILED DESCRIPTION OF THE PREFERRED EMBODIMENTS

Figure 1:
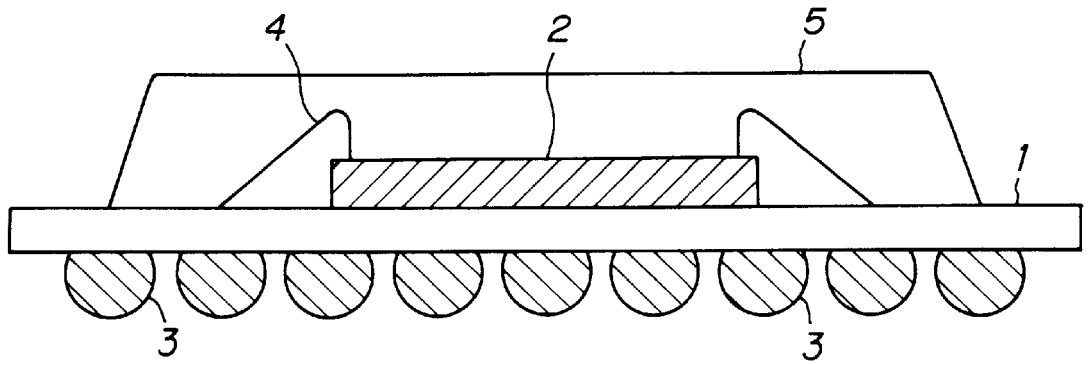
FIG. 1 is a sectional side view of an electronic device of the related art of a kind to which the invention relates.

Preferred embodiments of the invention will now be described in detail with reference to the accompanying drawings.

FIG. 3 is a view of a preferred embodiment of a printed wiring board and an electronic device using this according to the invention.

In this preferred embodiment the invention is applied to a BGA-type semiconductor device, and parts of the device the same as those in the device of the related art described above have been given the same reference numbers in the drawings.

Figure 3A:
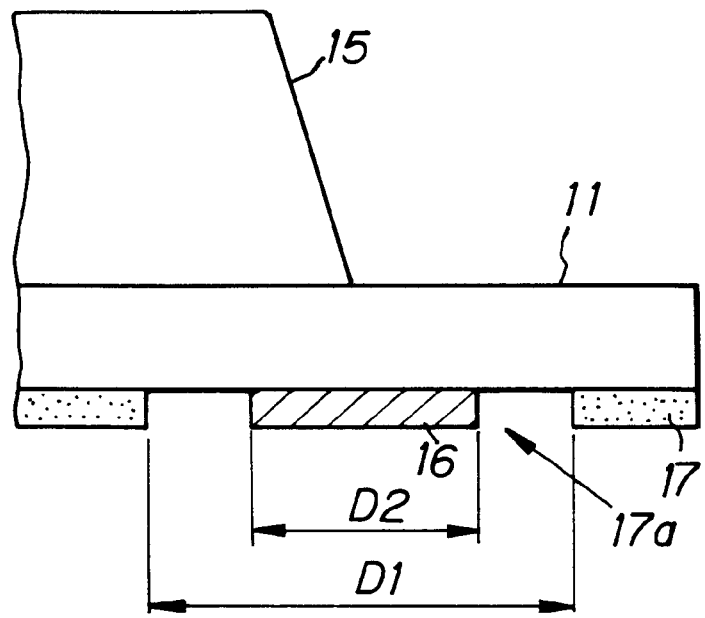
FIG. 3A and FIG. 3B are partial sectional side views of an electrode base structure of a preferred embodiment of an electronic device according to the invention.

First, in FIG. 3A, a chip-form semiconductor device (not shown) is mounted on the obverse side (the upper side in the drawing) of a printed wiring board 11 having an organic material or an inorganic material as its base material, and this semiconductor device is connected to a wiring pattern on the board by wire bonding and encapsulated with molded resin 15.

Wiring patterns made of a conducting material such as copper foil are formed on the obverse and reverse sides of the printed wiring board 11, and lands 16 of about 0.6 to 0.7 mm in diameter are formed in the wiring pattern on the reverse side (the lower side in the drawing) of the printed wiring board 11 where external electrodes which will be further discussed later are to be formed. Numerous such lands 16 are provided in correspondence with the number of electrodes to be formed on the printed wiring board 11 and disposed on the reverse side of the board for example in the form of a matrix.

Also, a pattern-protecting film 17 made of an insulating material such as solder resist is formed on the wiring pattern on the printed wiring board 11. This pattern-protecting film 17 is for protecting the wiring pattern formed on the board and preventing short-circuiting caused by solder bridges and the like, and has openings 17a where the above-mentioned lands 16 are formed, i.e. where the external electrodes (discussed later) are to be formed.

Figure 2A:
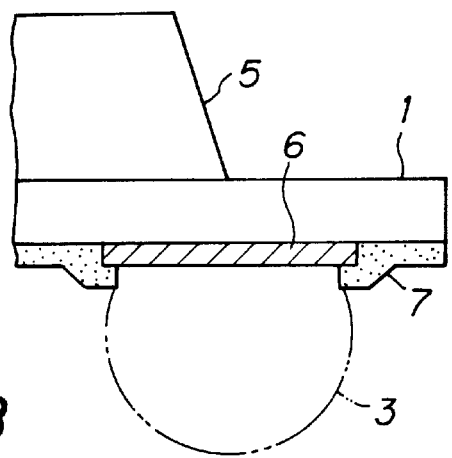
FIG. 2A and FIG. 2B are enlarged partial sectional side views of an electrode base structure of the electronic device of FIG. 1.
Figure 2B:
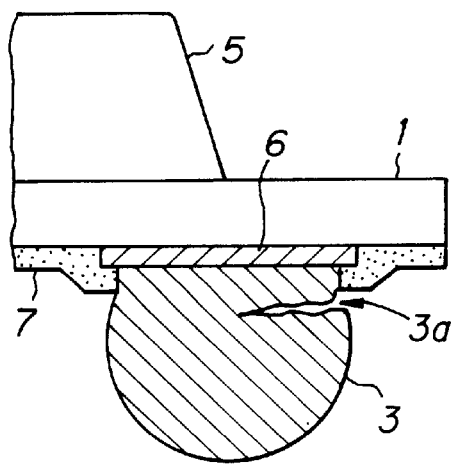

Here, whereas in a board structure of the related art the pattern-protecting film 7 is formed on the peripheral portions of the lands 6, as shown in FIG. 2A and FIG. 2B, in the printed wiring board 11 of this preferred embodiment the diameter D1 of the openings 17a in the pattern-protecting film 17 is set larger than the external diameter D2 of the lands 16 (D1>D2) by a predetermined dimension (discussed later), whereby a suitable gap is provided between each of the lands 16 and the pattern-protecting film 17.

In this case, because the external diameter D2 of the lands 16 is determined by the size of the external electrodes required, the pattern-protecting film 17 opening diameter D1 is set with this as a reference. That is, the pattern-protecting film 17 opening diameter D1 is suitably set according to the external diameter D2 of the lands 16 and the size of the external electrodes so that a small gap is provided between each of the external electrodes and the pattern-protecting film 17 when the external electrodes are formed on the lands 16.

In this preferred embodiment, with respect to lands 16 whose external diameter D2 is 0.6 mm the pattern-protecting film 17 opening diameter D1 is set to 0.75 mm, and a gap of over 0.05 mm is thereby provided between the pattern-protecting film 17 and each of the lands 16.

Figure 3B:
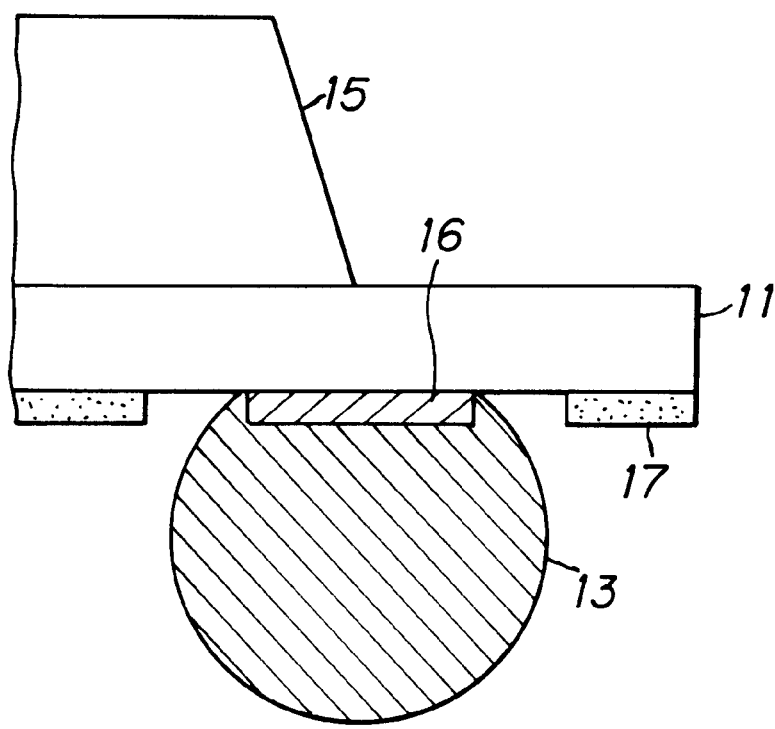

In this way, in an electronic device constructed using the printed wiring board 11, for example the BGA-type semiconductor device disclosed in this preferred embodiment, as shown in FIG. 3B, gaps are always formed between the external electrodes 13 formed on the lands 16 by heating and melting solder grains or solder paste or the like and the pattern-protecting film 17 around them.

Consequently, even when a temperature cycle test or the like is carried out, the external electrodes 13 and the pattern-protecting film 17, the thermal expansion coefficients of which are greatly different, are kept out of contact with each other and consequently thermal stresses do not act in the base portions of the external electrodes 13 as has happened in devices of the related art of this kind.

As a result, because the formation of cracks and the like is certainly avoided, it is possible to eliminate various problems caused by the external electrodes 13 coming off and oxidation of insides of cracks in the external electrodes 13.

Now, as regards the shape of the lands 16 on the printed wiring board 11, besides the case of forming them at the end of portions of the wiring pattern, there are cases wherein to stabilize the electrical connection of an electronic component (a semiconductor device or the like) lands 16 are formed by openings 17a in a pattern-protecting film 17 within copper foil portions of relatively large areas (hereinafter called solid patterns).

In such cases, the electrode base structure described above can be employed unchanged with respect to lands 16 formed on end portions of the wiring pattern, but with respect to lands 16 formed by the pattern-protecting film 17 in solid patterns, because the external diameter D2 of the lands 16 is determined by the diameter D1 of the openings in the pattern-protecting film 17, some kind of modification is necessary.

Accordingly, in another preferred embodiment, the following electrode base structure is used to make it possible to employ the board structure of this invention with respect to lands formed in solid patterns.

Figure 4A:
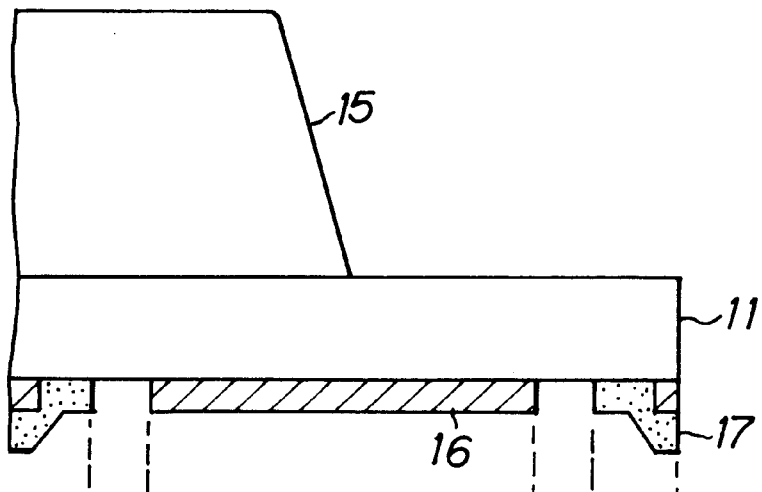
FIG. 4A is a partial side view and FIG. 4B a partial schematic bottom view of an electrode base structure of another preferred embodiment of an electronic device according to the invention.
Figure 4B:
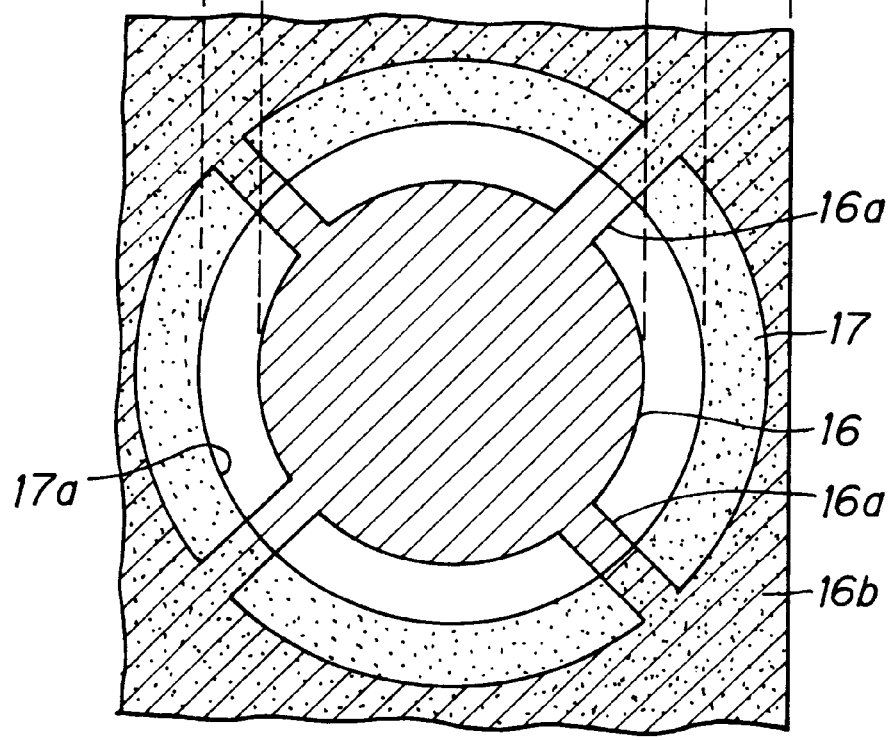

FIG. 4A and FIG. 4B are views illustrating this second preferred embodiment of the invention, FIG. 4A being a side view and FIG. 4B a schematic underside view of the electrode base structure thereof.

First, in FIG. 4A, 11 is a printed wiring board, 15 is a molded resin encapsulating a semiconductor device not shown in the drawings, 16 is a land formed in a solid pattern and 17 is a pattern-protecting film made of solder resist or the like.

In FIG. 4B, pattern regions made of copper foil or the like are shown with hatching, and the pattern-protecting film 17 deposited thereon is shown with small dots.

As shown in FIG. 4A and FIG. 4B, the land 16 is formed in the solid pattern in a substantially circular section with a predetermined external diameter, that is, an external diameter D2 corresponding to the size of the external electrodes required. For example, four connecting patterns 16a of preferable width 0.1 to 0.2 mm are led out on diagonal lines from the peripheral portion of this land 16, and the land 16 is connected to the solid pattern 16b around it by these connecting patterns 16a.

The pattern-protecting film 17 is deposited so that it covers all of the solid pattern 16b around the land 16. Also, the pattern-protecting film 17 opening diameter D1 in the solid pattern 16b is greater by a predetermined dimension than the external diameter D2 of the land 16, as in the first preferred embodiment described above; that is, the opening diameter D1 is set to such a size that an external electrode not shown in the drawings formed on the land 16 does not make contact with the pattern-protecting film 17.

In this preferred embodiment, by providing a gap of 0.1 mm between the land 16 and the solid pattern 16b around the land 16 and setting the opening diameter D1 so that the opening 17a in the pattern-protecting film 17 extends to an intermediate part of that gap, as in the first preferred embodiment described above a gap of over 0.05 mm is provided between the land 16 and the pattern-protecting film 17.

By employing this kind of board structure, even when a land 16 is formed in a solid pattern 16b, contact between an external electrode (not shown in the drawings) formed on the land 16 and a pattern-protecting film 17 can be avoided. Therefore, in an electronic device using this board structure, because thermal stresses do not act in the base portions of the external electrodes, as in the first preferred embodiment described above, the formation of cracks and the like can be certainly prevented.

In the constructions of the preferred embodiments described above, a BGA-type semiconductor device was disclosed as an example of an electronic device; however, the invention is not limited to this and can be widely applied to various electronic devices such as those wherein on at least one side of a printed wiring board 11 having lands for forming external electrodes on there is mounted an active component other than the semiconductor device mentioned above, for example a transistor or the like, or a passive component such as an inductor. Thus, electronic modules having such electronic devices can be widely used by being incorporated into a variety of types of electronic equipment.

As described above, according to this invention, because by the diameter of openings in a pattern-protecting film being set greater than the external diameter of lands for forming external electrodes on formed on a printed wiring board, a gap is provided between the pattern-protecting film and each of the external electrodes on the lands when the external electrodes are formed, thermal stresses caused by thermal expansion coefficient differences between the materials do not act in the base portions of the external electrodes and the formation of cracks in the electrode base portions is prevented.

As a result, various problems caused by crack formation, for example external electrodes coming off and fluctuations in resistance caused by oxidation of insides of cracks formed in external electrodes can be eliminated so that the present invention can greatly contribute also to the enhancement of the reliability of the electronic device.

Also, because the external electrodes 13 and the pattern-protecting film 17 around them do no make contact, the positions where the external electrodes 13 are formed are determined solely by the lands 16, which are connecting parts of the external electrodes. Therefore, as a result of the displacement of the pattern-protecting film 17 around the external electrodes 13, it is possible to keep the positional accuracy of the external electrodes 13 at the same level as the positional accuracy of the lands 16 (within 50 μm).

Furthermore, because according to this invention it is possible to make the size of the lands 16 of the external electrodes 13 smaller than in the related art by about 0.1 to 0.2 mm, it is possible to increase the number of wiring lines between adjacent external electrodes 13 by one or more. As a result, design of the wiring pattern becomes easier.

What is claimed is:

1. An electronic module comprising an electronic device having an electronic component mounted on at least one side of a printed wiring board electrically connected to an external electrode through a wiring pattern, and a mother board on which the electronic device is mounted through the external electrode, wherein:

the printed wiring board having on one side thereof a land formed in the wiring pattern at a position where the external electrode is formed and a pattern protecting film wherein there is a gap between the pattern protecting film and the land and further wherein the pattern protecting film is at least substantially uniformly spaced apart from and at least substantially surround the land.

2. An electronic module according to claim 1, wherein the wiring pattern and the land are connected to each other by a connecting pattern connected to a peripheral portion of the land.

\* \* \* \* \*